United States Patent
Peng et al.

(10) Patent No.: US 7,755,902 B2
(45) Date of Patent: Jul. 13, 2010

(54) HEAT DISSIPATION DEVICE FOR COMPUTER ADD-ON CARDS

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 79 days.

(21) Appl. No.: 12/200,878

(22) Filed: Aug. 28, 2008

(65) Prior Publication Data

US 2009/0310296 A1 Dec. 17, 2009

(30) Foreign Application Priority Data

Jun. 13, 2008 (CN) .................... 2008 1 0067739

(51) Int. Cl.
*H05K 7/20* (2006.01)
(52) U.S. Cl. .............. 361/719; 361/700; 361/704; 361/720; 165/80.3; 165/104.33; 165/185; 257/714; 257/720
(58) Field of Classification Search .......... 361/695, 361/697, 700, 703, 704, 719, 720
See application file for complete search history.

(56) References Cited

U.S. PATENT DOCUMENTS

| 6,438,984 | B1* | 8/2002 | Novotny et al. ............ 62/259.2 |
| 6,478,082 | B1* | 11/2002 | Li ........................... 165/185 |
| 6,671,177 | B1* | 12/2003 | Han .......................... 361/719 |
| 6,754,077 | B2* | 6/2004 | Lo et al. ..................... 361/700 |
| 7,283,364 | B2* | 10/2007 | Refai-Ahmed et al. ...... 361/719 |
| 7,443,672 | B2* | 10/2008 | Peng et al. .................. 361/695 |
| 7,551,442 | B2* | 6/2009 | Stefanoski .................. 361/700 |
| 7,626,821 | B1* | 12/2009 | Buffington .................. 361/719 |
| 2002/0172008 | A1* | 11/2002 | Michael ..................... 361/697 |
| 2009/0059525 | A1* | 3/2009 | Peng et al. .................. 361/697 |
| 2009/0059538 | A1* | 3/2009 | Peng et al. .................. 361/719 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat dissipation device to be mounted on a heat-generating component of a graphics card includes a base in contact with the heat-generating component, a heat dissipating member placed on the base, a fan mounted on the base adjacent to an end of the base, and a covering body. The fan is located closely to the heat dissipating member and generates airflow to the heat dissipating member. The dissipating member has a cellular structure integrally formed therein. The covering body includes a top wall in contact with a top of the dissipating member and a sidewall extending downwardly from an edge of the top wall and surrounding the dissipating member and the fan. The cellular structure comprises a plurality of elongated passages extending from the fan to another end of the base away from the fan.

13 Claims, 3 Drawing Sheets

HEAT DISSIPATION DEVICE FOR COMPUTER ADD-ON CARDS

BACKGROUND OF THE INVENTION

1. Field of the Invention

The present invention relates to heat dissipation and particularly to a heat dissipation device for computer add-on cards.

2. Description of Related Art

To enable increased functionality, desktop and other computers normally employ supplemental circuitry mounted on removable add-on cards. Specifically, to enhance display capability, graphics cards are often implemented. Such cards comprise a separate dedicated processor, called a GPU (graphics processor unit). The GPU generates considerable heat during operation. When the temperature of the GPU exceeds a certain threshold, the GPU may malfunction, or even fail outright. For this reason, a heat dissipation device is commonly installed onto the GPU to dissipate the heat generated by the GPU and other electronic components adjacent thereto it into the surrounding environment.

Conventionally, the heat dissipation device comprises a solid base, a plurality of fins arranged on one end thereof and a fan mounted on the other end thereof to accelerate airflow across the fins. The base attached to the GPU and mounted on the graphics card absorbs heat generated by the GPU. However, only a part of the base, usually the center, contacts the GPU. Heat generated by the GPU is directly absorbed thereby and is not well distributed to other parts of the base. This results in overheating of the middle part of the base, while the temperature of the other parts of the base remains lower. The fins on the other parts of the base away from the middle part of the base are not effectively used, resulting in an overall reduction of efficiency of the heat dissipation device. In addition, each of the fins conventionally has a flange extending from a bottom edge thereof and soldered to a top surface of the base to fix the individual fin thereon. The flange of each of the fins is narrow enough that connective integrity thereof is too weak to securely fix the fin to the base in use. As a result, the fins are in high risk of suffering disengagement from the base, thereby being forced into a sympathetic vibration and producing noise in response to high-frequency vibration from the running fan.

Accordingly, what is needed is a heat dissipation device addressing the described limitations.

SUMMARY OF THE INVENTION

A heat dissipation device, mountable on a heat-generating component of a graphics card, includes a base in contact with the heat-generating component, a heat dissipating member placed on the base, a fan mounted on the base adjacent to an end of the base, and a covering body. The fan is close to the heat dissipating member and generates airflow thereto. The dissipating member has an integral cellular structure. The covering body includes a top wall in contact with a top of the dissipating member and a sidewall extending downwardly from an edge of the top wall and surrounding the dissipating member and the fan. The cellular structure consists of a plurality of elongated passages with openings facing the fan.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
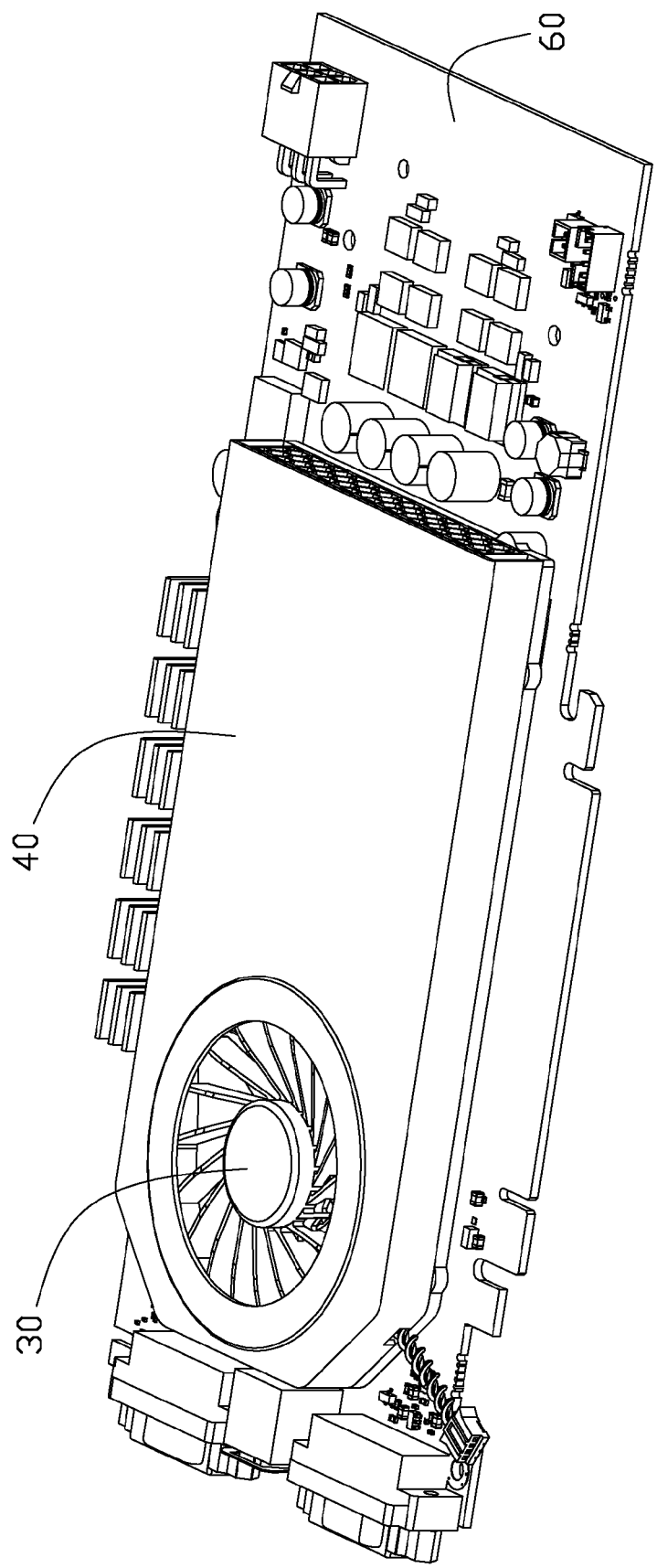
FIG. 1 is an isometric, assembled view of a heat dissipation device in accordance with a preferred embodiment of the present invention.
Figure 2:
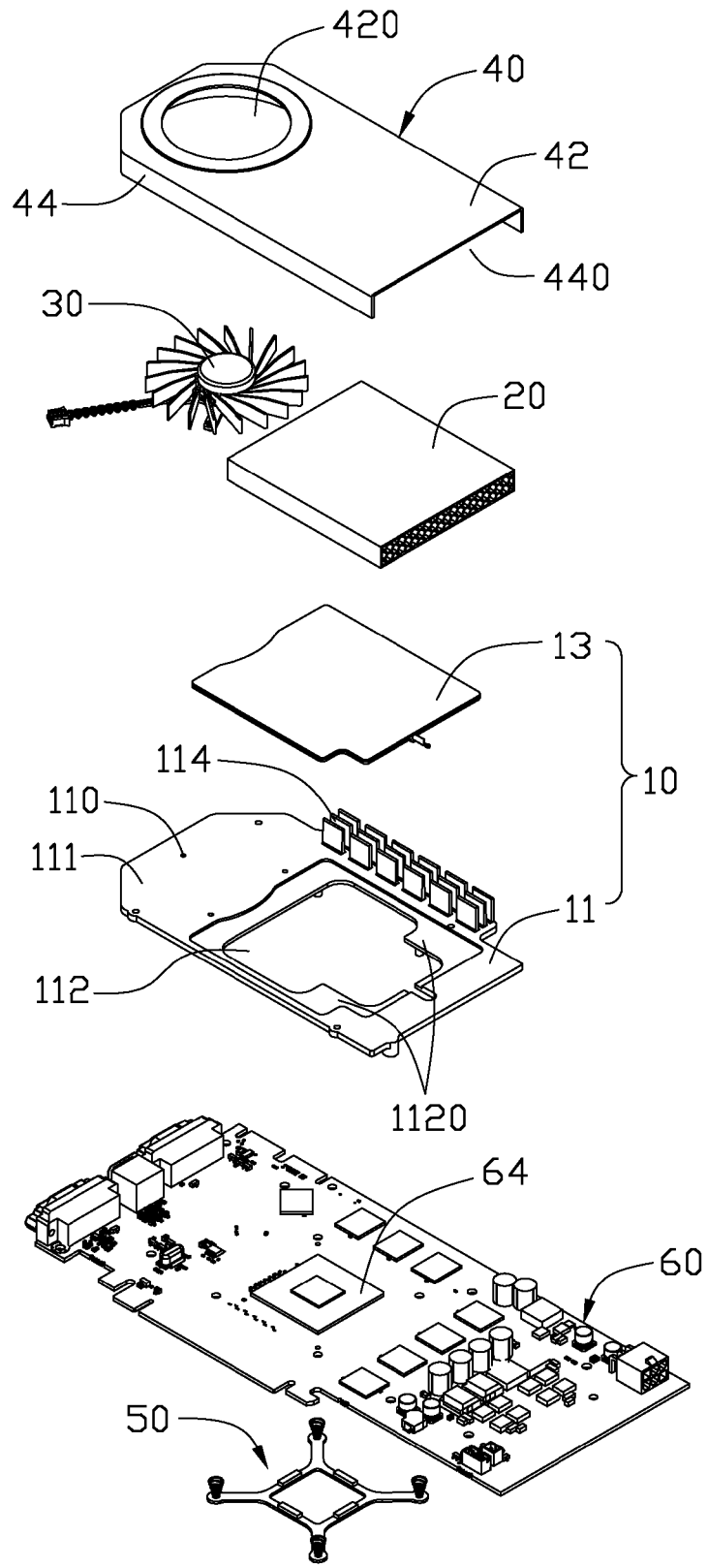
FIG. 2 is an exploded view of FIG. 1.

Referring to FIGS. 1-2, a heat dissipation device in accordance with a preferred embodiment of the present invention removes heat from a heat-generating electronic component such as a GPU 64 (graphics processor unit) mounted on a printed circuit board such as a computer add-on card 60.

The heat dissipation device comprises a base 10 in contact with the GPU 64, a heat dissipating member 20 arranged on the base 10, a fan 30 mounted on the base 10, adjacent to an end of the base 10 and located at a side of the heat dissipating member 20, and a cover body 40 positioned on the base 10 and covering the fan 30 and the heat dissipating member 20.

The base 10 comprises a base plate 11 and a conductive envelope 13 embedded in the base plate 11. The base plate 11 is integrally formed of light metal with high heat conductivity such as aluminum, minimizing weight of the base 10. The base plate 11 has a flat mounting portion 111. The mounting portion 111 defines a plurality of spaced mounting holes 110 therein for mounting the fan 30 on the mounting portion 111. The base plate 11 defines a rectangular opening 112 therein beside the mounting portion 111. The conductive envelope 13 covers the opening 112 of the base plate 11 to attach to the GPU 64. The base plate 11 is provided with a supporting flange 1120 that extends inwardly from a lower portion of the base plate 11 surrounding the opening 112. The supporting flange 1120 is lower than a top surface of the base plate 11. Portions of the supporting flange 1120 at four corners of the opening 112 extend inwardly further than remainder of the supporting flange 1120 so as to securely support the conductive envelope 13 thereon. The base plate 11 has a plurality of vanes 114 extending upwardly and perpendicularly from a top surface of the mounting portion 111 and adjacent to a rear side of the base plate 11. The vanes 114 are spaced from each other, and parallel to two opposite long sides of the base plate 11.

The conductive envelope 13 is a flat heat pipe, lighter and more heat conductive than a solid metallic plate such as copper in an equal volume. The conductive envelope 13 defines a cavity (not shown) therein containing working fluid. The working fluid can change phase when functioning. The conductive envelope 13 has a central portion (not shown) thereof protruding downwardly to define a rim portion (not shown) around the central portion of the conductive envelope 13 to complement the supporting flange 1120 of the base plate 11. The top surface of the base plate 11 and the conductive envelope 13 are coplanar to cooperatively form a contact surface, when the conductive envelope 13 is placed in the opening 112 of the base plate 11. The bottom surface of the base plate 11 and a bottom surface of the central portion of the conductive envelope 13 are coplanar.

Figure 3:
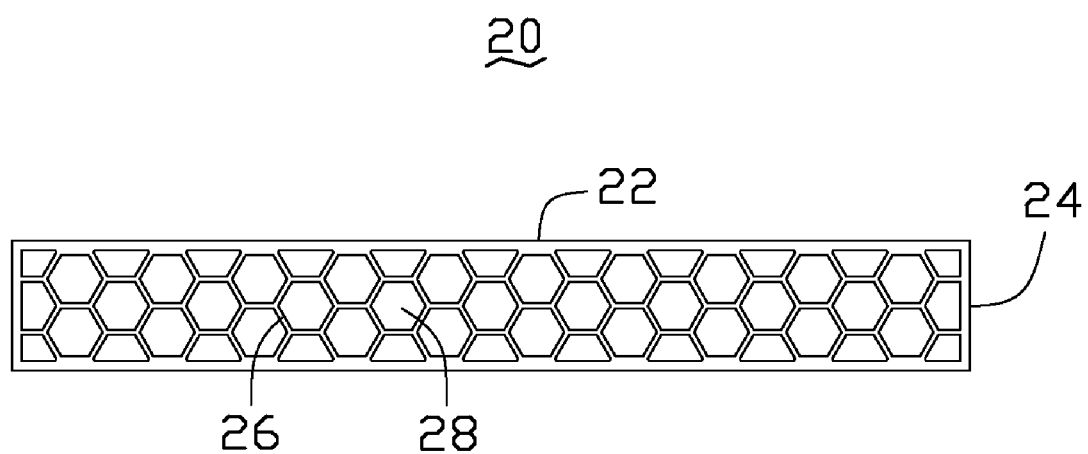
FIG. 3 is a side elevational view of a dissipating member in FIG. 2.

Also referring to FIG. 3, the heat dissipating member 20 is cuboid and fixed on the contact surface of the base 10. The heat dissipating member 20 comprises two horizontal plates 22 spaced from each other and two vertical plates 24 interconnecting corresponding lateral sides of the two horizontal plates 22. The dissipating member 20 defines a channel therein formed by the horizontal and vertical plates 22, 24. A cellular structure 26 is integrally formed in the channel and comprises a plurality of elongated passages 28 parallel to both the horizontal and vertical plates 22, 24. The elongated passages 28 have inlets located close to and facing the fan 30 and outlets located at another end of the base 10 away from the fan 30. The elongated passages 28 can be of various cross sections, such as circular, polygonal or other anomalous polygon. In this embodiment, the elongated passages 28 are hexagonal in cross section.

The fan 30, centrifugal and comprising a fan holder (not labeled), is mounted on the mounting portion 111 of the base plate 11 through the fan holder by a plurality of screws extending through the fan holder and engagingly received in the mounting holes 110 of the base plate 11.

The cover body 40 is highly heat conductive and comprises a top wall 42 parallel to the base 10 and a sidewall 44 extending downwardly and perpendicularly from an edge of the top wall 42. The top wall 42 defines a circular intake 420 therein in alignment with the fan 30. A cutout 440 is formed by the sidewall 44 between the cover body 40 and the base 10. The cutout 440 is perpendicular to and communicates with the intake 420 and is positioned corresponding to the outlets of the elongated passages 28 of the heat dissipating member 20.

In assembly of the heat dissipating device, the heat dissipating member 20 is attached to the contact surface of the base 10 by means such as soldering and adhesion. The fan 30 is mounted on the mounting portion 111 of the base 10, introducing airflow into the elongated passages 28 of the heat dissipating member 20. The cover body 40 is secured on the base 10 and encloses the heat dissipating member 20 and the fan 30 therein. A top surface of the upper horizontal plate 22 of the dissipating member 20 is kept in close contact with a bottom surface of the top wall 42 of the cover body 40. The outlets of the elongated passages 28 of the dissipating member 20 apart from the fan 30 reach the outside environment through the cutout 440 of the cover body 40.

In operation, the heat dissipating device is mounted on the add-on card 60 by fixtures (not shown) extending through the base 10 to engage with a back plate 50 (shown in FIG. 1) located under the add-on card 60. The conductive envelope 13 of the base 10 maintains close contact with the GPU 64 and absorbs heat generated thereby. Due to the excellent heat conductivity of the conductive envelope 13, the heat from the GPU 64 is quickly transferred to all parts of the conductive envelope 13, for even and effective distribution to the entire heat dissipating member 20 and finally introduced to the external atmosphere by the airflow produced by fan 30 through the elongated passages 28 of the heat dissipating member 20. The heat dissipating member 20 is integrally formed and tightly sandwiched between the top wall 42 of the cover body 40 and the base 10, thereby immune to the effects of high-frequency vibration from the fan 30 and more stably situated.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device mountable on a heat-generating component, comprising:

a base in contact with the heat-generating component;

a heat dissipating member on the base and having a cellular structure integrally formed therein;

a fan mounted on the base adjacent to an end of the base close to the heat dissipating member and generating airflow to the heat dissipating member; and a covering body comprising a top wall in contact with a top of the heat dissipating member and a sidewall extending downwardly from an edge of the top wall and surrounding the heat dissipating member and the fan;

wherein the cellular structure of the heat dissipating member comprises a plurality of elongated passages extending from an end of the heat dissipating member adjacent to the fan to another end of the base away from the fan; and wherein the base comprises a base plate defining an opening therein and a conductive envelope which is a plate-shaped vapor chamber received in the opening.

2. The heat dissipation device as described in claim 1, wherein the elongated passages each have one of following configurations: circular, polygonal, and anomalously polygonal in cross section.

3. The heat dissipation device as described in claim 1, wherein the elongated passages are parallel to the base and the top wall of the covering body and are hexagonal in cross section.

4. The heat dissipation device as described in claim 1, wherein the heat dissipating member comprises two horizontal plates respectively attached to a bottom surface of the top wall of the covering body and a top surface of the base, and two vertical plates interconnecting corresponding lateral sides of the two horizontal plates.

5. The heat dissipation device as described in claim 4, wherein the horizontal and vertical plates are all parallel to the elongated passages.

6. The heat dissipation device as described in claim 1, wherein a top surface of the conductive envelope and a top surface of the base plate are coplanar and cooperatively define a contact surface on which the heat dissipating member is mounted.

7. The heat dissipation device as described in claim 1, wherein the covering body is heat conductive and defines an intake above the fan in the top wall thereof and a cutout in the sidewall thereof, introducing ends of the elongated passages of the heat dissipating member to the external atmosphere.

8. The heat dissipation device as described in claim 1, wherein the base comprises a plurality of vanes extending upwardly from a top surface of the base and located at a side of the covering body.

9. A heat dissipation device, mountable on a heat-generating component, and comprising:

a base in contact with the heat-generating component, comprising a base plate defining an opening therein and a conductive envelope comprising a plate-shaped vapor chamber received in the opening;

a heat dissipating member comprising two horizontal plates and two vertical plates interconnecting corresponding lateral sides of the two horizontal plates and having a cellular structure integrally formed in a space defined by the horizontal and vertical plates;

a fan mounted on the base and adjacent to an end of the base, close to the heat dissipating member and generating airflow to the heat dissipating member; and a covering body comprising a top wall and a sidewall extending downwardly from an edge of the top wall and surrounding the heat dissipating member and the fan;

wherein the two horizontal plates are respectively attached to a bottom surface of the top wall of the covering body and a top surface of the conductive envelope, and the cellular structure comprises a plurality of elongated passages extending from an end of the heat dissipating member adjacent to the fan to another end of the base remote from the fan.

10. The heat dissipation device as described in claim 9, wherein the elongated passages each have one of following configurations: circular, polygonal, and anomalously polygonal in cross section.

11. The heat dissipation device as described in claim 9, wherein the elongated passages are parallel to the horizontal and vertical plates and are hexagonal in cross section.

12. The heat dissipation device as described in claim 9, wherein a top surface of the conductive envelope and a top surface of the base plate are coplanar and cooperatively define a contact surface on which the heat dissipating member is attached.

13. The heat dissipation device as described in claim 9, wherein the covering body is heat conductive and defines an intake above the fan in the top wall thereof and a cutout in the sidewall thereof, exposing ends of the elongated passages of the heat dissipating member to the external atmosphere.

* * * * *